(12) United States Patent
Frohberg et al.

(10) Patent No.: US 9,196,684 B2
(45) Date of Patent: Nov. 24, 2015

(54) TENSILE NITRIDE PROFILE SHAPER ETCH TO PROVIDE VOID FREE GAPFILL

(71) Applicant: GLOBALFOUNDRIES INC., Grand Cayman (KY)

(72) Inventors: Kai Frohberg, Niederau (DE); Peter Moll, Dresden (DE); Dominik Olligs, Dresden-Langebrueck (DE); Heike Scholz, Hirschfeld (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/254,710

(22) Filed: Apr. 16, 2014

(65) Prior Publication Data

US 2015/0303261 A1 Oct. 22, 2015

(51) Int. Cl.
*H01L 21/8238* (2006.01)
*H01L 29/10* (2006.01)

(52) U.S. Cl.
CPC .... *H01L 29/1054* (2013.01); *H01L 21/823807* (2013.01); *H01L 21/823878* (2013.01)

(58) Field of Classification Search
CPC ............... H01L 21/823807; H01L 29/7843; H01L 29/6656; H01L 21/823864; H01L 23/485; H01L 21/823468; H01L 21/3185; H01L 21/0217; H01L 21/76832; H01L 21/31053
See application file for complete search history.

(56) References Cited

U.S. PATENT DOCUMENTS

| | | | |
|---|---|---|---|
| 2007/0020838 A1* | 1/2007 | Zhu et al. | 438/199 |
| 2008/0081480 A1* | 4/2008 | Frohberg et al. | 438/703 |
| 2010/0244132 A1* | 9/2010 | Balch et al. | 257/347 |
| 2013/0161192 A1* | 6/2013 | Shim et al. | 204/601 |

\* cited by examiner

*Primary Examiner* — Yasser A Abdelaziez
*Assistant Examiner* — Farun Lu
(74) *Attorney, Agent, or Firm* — Ditthavong & Steiner, P.C.

(57) ABSTRACT

A method of reducing the impact of FEoL topography on dual stress liner depositions and the resulting device are disclosed. Embodiments include forming a first nitride layer between and over a pFET and an nFET; thinning the first nitride layer; forming a second nitride layer over the first nitride layer; and removing the first and the second nitride layers from over the pFET.

19 Claims, 3 Drawing Sheets

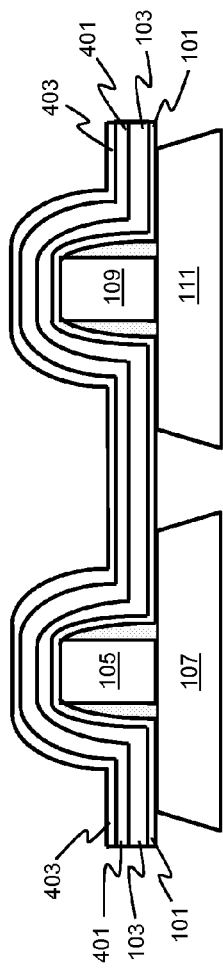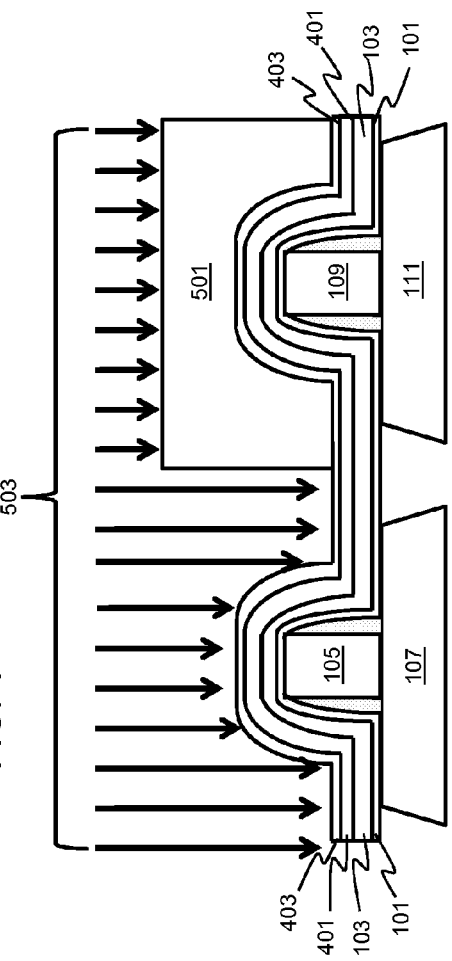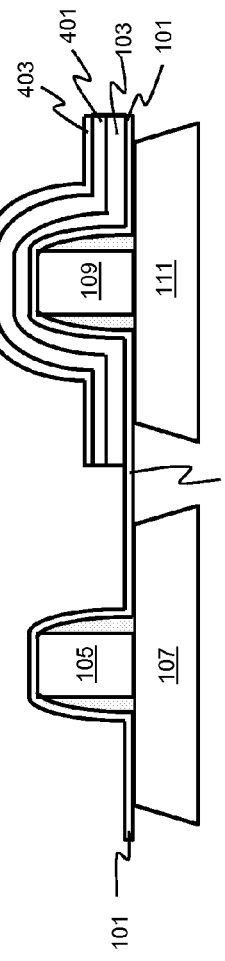

TENSILE NITRIDE PROFILE SHAPER ETCH TO PROVIDE VOID FREE GAPFILL

TECHNICAL FIELD

The present disclosure relates to a method of manufacturing a semiconductor device having submicron features. The present disclosure is particularly applicable to manufacturing semiconductor devices for high-performance applications.

BACKGROUND

Increases in integration density of semiconductor integrated circuits provides both economic and performance benefit, but also implies extremely fine patterning of the features. In particular, the space between transistor gates has been dramatically reduced with increasing integration density. Consequently, the deposition of dielectric materials for the contact layer becomes more and more challenging in terms of enabling void-free gapfill. This is especially true since the incoming topography from the front-end-of-line (FEoL) processing can have a significant impact on the fill performance of the following layer depositions. With current state-of-the-art deposition processes, e.g., chemical vapor deposition (CVD), it is no longer possible to fill the gaps between the gates. Electrical shorts between adjacent contacts in dense gate structures can be caused by voids in the contact interlayer dielectric (ILD) filled with metal from the contact metallization. Moreover, in cases where the contacts are on different active areas, the electrical short may lead to a failure of the electrical device.

A need therefore exists for methodology reducing the impact of FEoL topography on following layer depositions for dual stress liners.

SUMMARY

An aspect of the present disclosure is a method of partially etching a tensile nitride liner between two gates followed by a second tensile liner deposition over the first liner.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first nitride layer between and over a p-channel metal-oxide-semiconductor field-effect transistor (pFET) and an n-channel metal-oxide-semiconductor field-effect transistor (nFET); thinning the first nitride layer; forming a second nitride layer over the first nitride layer; and removing the first and the second nitride layers from over the pFET.

Aspects of the present disclosure include forming the first and the second nitride layers of tensile plasma enhanced silicon nitride (tPEN). Other aspects include forming a first oxide layer between and over the pFET and the nFET prior to forming the first nitride layer. Further aspects include forming the first oxide layer and the first nitride layer in a single deposition step. Another aspect includes forming the first oxide layer to a thickness of 65 angstroms (Å) to 75 Å; and forming the first nitride layer to a thickness of 240 Å to 300 Å. Additional aspects include thinning the first nitride layer by a profile shaper etch. Other aspects include shaping the first nitride layer by reactive ion etching (RIE). Further aspects include etching 168 Å to 210 Å of the first nitride layer. Another aspect includes forming the second nitride layer over the first nitride layer to a combined thickness of 245 Å to 295 Å. Additional aspects include forming a second oxide layer over the second nitride layer prior to removing the first and the second nitride layers from over the pFET. Other aspects include removing the first and the second nitride layers from over the pFET by: forming a mask over the nFET on the second oxide layer; etching the second oxide layer and the first and second nitride layers over the pFET down to the first oxide layer; and removing the mask. Further aspects include forming a third nitride layer of compressive plasma enhanced silicon nitride (cPEN) over the first oxide layer over the pFET and the second oxide layer over the nFET; and removing the third nitride layer from over the nFET down to the second oxide layer.

Another aspect of the present disclosure is a method including: forming a stop oxide (STOX) layer between and over a pFET and an nFET; forming a first tPEN layer on the STOX layer; thinning the first tPEN layer; forming a second tPEN layer over the first tPEN layer; forming an endpoint oxide (EPOX) layer over the second tPEN layer; removing the EPOX layer and the first and second tPEN layers from over the pFET; forming a cPEN layer over the STOX and EPOX layers; and removing the cPEN layer from over the nFET down to the EPOX layer. Aspects of the present disclosure include forming the STOX layer and the first tPEN layer in a single deposition step. Other aspects include thinning the first tPEN layer by a profile shaper etch. Further aspects include shaping the first tPEN layer by RIE. Another aspect includes etching 168 Å to 210 Å of the first tPEN layer. Additional aspects include forming the second tPEN layer over the first tPEN layer to a combined thickness of 245 Å to 295 Å. Other aspects include removing the EPOX and the first and second tPEN layers from over the pFET by: forming a mask over the nFET on the EPOX layer; etching the EPOX layer and the first and the second tPEN layers over the pFET down to the STOX layer; and removing the mask.

A further aspect of the present disclosure is a method including: forming a STOX layer between and over a pFET and an nFET; forming a first tPEN layer on the STOX layer; thinning 168 Å to 210 Å of the first tPEN layer by a profile shaper etch step using RIE; forming a second tPEN layer over the first tPEN layer to a combined thickness of 245 Å to 295 Å; forming an EPOX layer over the second tPEN layer; removing the EPOX layer, the first and the second tPEN layers from over the pFET by RIE down to the STOX layer; forming a cPEN layer over the STOX layer and the EPOX layer; and etching the cPEN layer over the nFET down to the EPOX layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIGS. 1 through 8 schematically illustrate a method of partially etching a tPEN liner over and between two gates followed by a second tPEN liner deposition over the first tPEN liner, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of gapfill voids resulting in electrical shorts, attendant upon depositing nitride stress liners in devices having submicron features. By partially etching a tPEN liner layer and then depositing a second tPEN liner layer over the first tPEN liner, the topography is smoothed, thereby reducing voids between the gates, which enables improved fill performance of following layer depositions.

Methodology in accordance with embodiments of the present disclosure includes forming a first nitride layer between and over a pFET and an nFET. The first nitride layer is thinned. A second nitride layer is formed over the first nitride layer. The first and the second nitride layers are removed from over the pFET.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
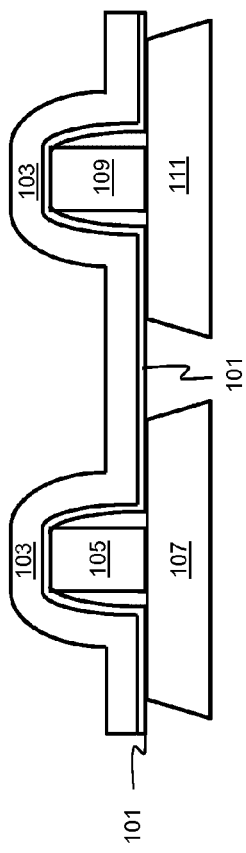
Figure 2:
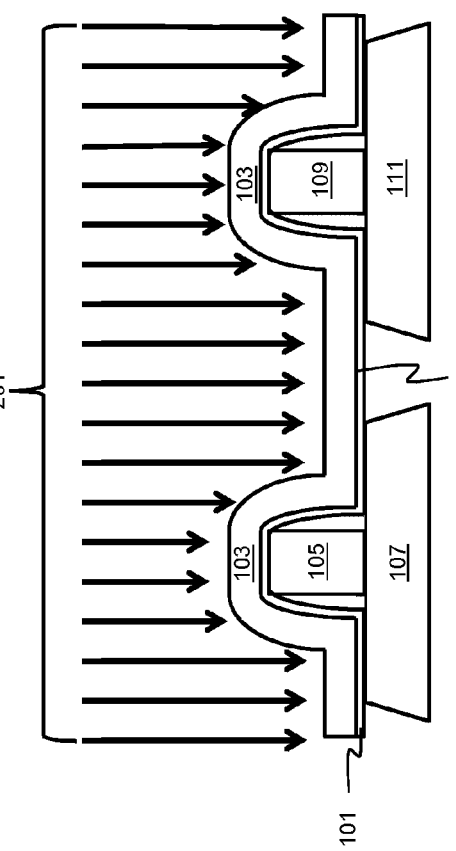
Figure 3:
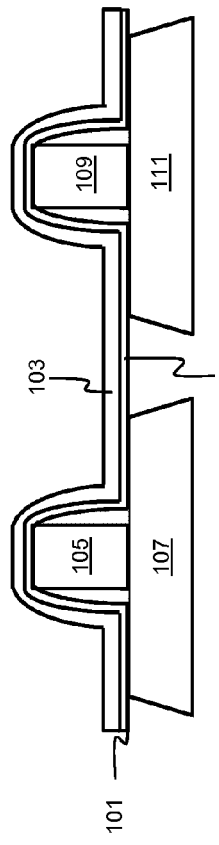

Adverting to FIG. 1, an oxide layer 101, e.g., STOX, and a nitride layer 103, e.g., tPEN, are formed in a single deposition step, e.g., by CVD, between and over a gate 105 of a pFET 107 and a gate 109 of an nFET 111. The oxide layer 101 and nitride layer 103 may be formed to thicknesses of 65 Å to 75 Å, e.g., 70 Å, and 240 Å to 300 Å, e.g., 270 Å, respectively. Next, the nitride layer 103 is thinned by a profile shaper etch, for example, by RIE, as depicted by the arrows 201 in FIG. 2. In particular, 168 Å to 210 Å of the nitride layer 103 is removed during the profile shaper etch of FIG. 2, as depicted in FIG. 3.

Adverting to FIG. 4, a nitride layer 401 is deposited, e.g., by CVD, over the thinned nitride layer 103 to a target combined thickness, for example 245 Å to 295 Å. Now, the standard patterning can be done using photolithographic techniques to form a photoresist mask with a pattern and to transfer the pattern to the underlying dielectric layers by plasma etching of the exposed regions, for example. In other words, an oxide layer 403, e.g., EPOX, is formed to a thickness of 135 Å to 185 Å over the nitride layer 401. Thereafter, a photoresist mask 501 is formed over the nFET 111 on the oxide layer 403, as depicted in FIG. 5. Once the mask is formed, the oxide layer 403 and the nitride layers 401 and 103 are patterned, or etched e.g., by RIE, with oxide layer 101 acting as an etch stop, as depicted by the arrows 503. The mask 501 is subsequently removed. Consequently, the oxide layer 403 and the nitride layers 401 and 103 are removed from over the pFET 107, as depicted in FIG. 6.

Figure 7:
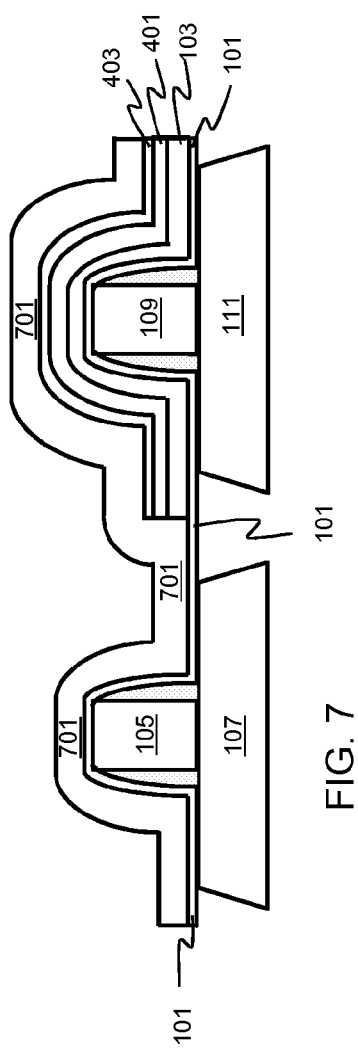
Figure 8:
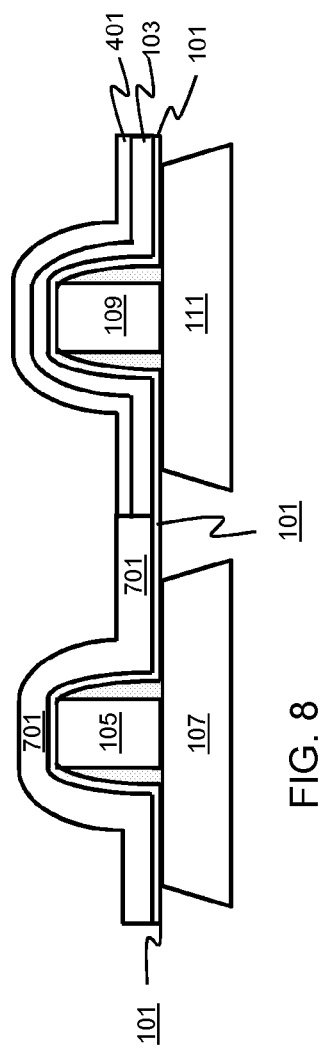

Adverting to FIG. 7, a nitride layer 701, e.g., cPEN, is formed over the oxide layer 101 and the oxide layer 403. Next, the nitride layer 701 is removed from over the nFET 111, stopping on the oxide layer 403 (not shown for illustrative convenience), and then the oxide layer 403 is removed (not shown for illustrative convenience). As a result, the nitride layers 103 and 401 are over the nFET and the nitride layer 701 is over the pFET, as depicted in FIG. 8.

The embodiments of the present disclosure can achieve several technical effects including smoothing the profile shapes between gates, which can reduce the impact of FEoL topography on dual stress liner depositions. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure is particularly applicable to manufacturing semiconductor devices for high-performance applications.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first nitride layer between and over a p-channel metal-oxide-semiconductor field-effect transistor (pFET) and an n-channel metal-oxide-semiconductor field-effect transistor (nFET);
   thinning the first nitride layer to a uniform thickness over the entire first nitride layer;
   forming a second nitride layer over the first nitride layer; and
   removing the first and the second nitride layers from over the pFET.

2. The method according to claim 1, comprising forming the first and the second nitride layers of tensile plasma enhanced silicon nitride (tPEN).

3. The method according to claim 1, further comprising forming a first oxide layer between and over the pFET and the nFET prior to forming the first nitride layer.

4. The method according to claim 3, comprising forming the first oxide layer and the first nitride layer in a single deposition step.

5. The method according to claim 3, comprising:
   forming the first oxide layer to a thickness of 65 angstroms (Å) to 75 Å; and
   forming the first nitride layer to a thickness of 240 Å to 300 Å.

6. The method according to claim 1, comprising thinning the first nitride layer by a profile shaper etch.

7. The method according to claim 6, comprising shaping the first nitride layer by reactive ion etching (RIE).

8. The method according to claim 7, comprising etching 168 Å to 210 Å of the first nitride layer.

9. The method according to claim 1, comprising forming the second nitride layer over the first nitride layer to a combined thickness of 245 Å to 295 Å.

10. The method according to claim 1, further comprising forming a second oxide layer over the second nitride layer prior to removing the first and the second nitride layers from over the pFET.

11. The method according to claim 10, comprising removing the first and the second nitride layers from over the pFET by:
forming a mask over the nFET on the second oxide layer;
etching the second oxide layer and the first and second nitride layers over the pFET down to the first oxide layer; and
removing the mask.

12. The method according to claim 10, further comprising:
forming a third nitride layer of compressive plasma enhanced silicon nitride (cPEN) over the first oxide layer over the pFET and the second oxide layer over the nFET; and
removing the third nitride layer from over the nFET down to the second oxide layer.

13. A method comprising:
forming a stop oxide (STOX) layer between and over a p-channel metal-oxide-semiconductor field-effect transistor (pFET) and an n-channel metal-oxide-semiconductor field-effect transistor (nFET);
forming a first tensile plasma enhanced silicon nitride (tPEN) layer on the STOX layer;
thinning the first tPEN layer to a uniform thickness over the entire first nitride layer;
forming a second tPEN layer over the first tPEN layer;
forming an endpoint oxide (EPOX) layer over the second tPEN layer;
removing the EPOX layer and the first and second tPEN layers from over the pFET;
forming a compressive plasma enhanced silicon nitride (cPEN) layer over the STOX and EPOX layers; and
removing the cPEN layer from over the nFET down to the EPOX layer.

14. The method according to claim 13, comprising forming the STOX layer and the first tPEN layer in a single deposition step.

15. The method according to claim 13, comprising thinning the first tPEN layer by a profile shaper etch.

16. The method according to claim 15, comprising shaping the first tPEN layer by reactive ion etching (RIE).

17. The method according to claim 16, comprising etching 168 angstroms (Å) to 210 Å of the first tPEN layer.

18. The method according to claim 13, comprising forming the second tPEN layer over the first tPEN layer to a combined thickness of 245 Å to 295 Å.

19. The method according to claim 13, comprising removing the EPOX and the first and second tPEN layers from over the pFET by:
forming a mask over the nFET on the EPOX layer;
etching the EPOX layer and the first and the second tPEN layers over the pFET down to the STOX layer; and
removing the mask.

\* \* \* \* \*